(12) United States Patent
Lasarov et al.

(10) Patent No.: US 9,294,600 B2
(45) Date of Patent: Mar. 22, 2016

(54) MOUNTING COMPONENTS IN ELECTRONIC DEVICES

(75) Inventors: Harri Aukusti Lasarov, Espoo (FI); Titta-Virva Juulia Wiberg, Hämeenlinna (FI)

(73) Assignee: NOKIA CORPORATION, Espoo (FI)

(*) Notice: Subject to any disclaimer, the term of this patent is extended or adjusted under 35 U.S.C. 154(b) by 1441 days.

(21) Appl. No.: 12/520,039

(22) PCT Filed: Dec. 21, 2006

(86) PCT No.: PCT/IB2006/055003
§ 371 (c)(1),
(2), (4) Date: Apr. 20, 2010

(87) PCT Pub. No.: WO2008/075139
PCT Pub. Date: Jun. 26, 2008

(65) Prior Publication Data
US 2010/0284552 A1    Nov. 11, 2010

(51) Int. Cl.
*H04R 25/00* (2006.01)
*H04M 1/18* (2006.01)
*B29C 45/14* (2006.01)
*H05K 5/06* (2006.01)
(Continued)

(52) U.S. Cl.
CPC ........... *H04M 1/18* (2013.01); *B29C 45/14549* (2013.01); *B29C 45/14639* (2013.01); *H05K 5/062* (2013.01); *H05K 5/065* (2013.01); *H04M 1/05* (2013.01); *H04R 1/02* (2013.01)

(58) Field of Classification Search
CPC ................. B29C 45/14549; B29C 45/14639; H04M 1/18; H04M 1/05; H04R 1/02; H04R 12/028; H04R 5/02; H04R 2205/021; H04R 2499/11; H05K 5/06–5/069
USPC ........... 381/87, 333–336, 345, 361, 374, 384, 381/189, 388, 392–393, 55; 337/34; 174/50–50.64, 520; 361/679.1
See application file for complete search history.

(56) References Cited

U.S. PATENT DOCUMENTS 5,220,480 A * 6/1993 Kershaw et al. ............. 361/117
5,938,956 A * 8/1999 Hembree et al. ............ 219/209
(Continued)

FOREIGN PATENT DOCUMENTS

EP    0792025 A1    8/1997
EP    1143687 A2    10/2001
(Continued)

OTHER PUBLICATIONS

International Search Report and Written Opinion of the International Searching Authority from PCT Application No. PCT/IB2006/055003, dated Aug. 1, 2007, 13 pages.

*Primary Examiner* — Xu Mei
(74) *Attorney, Agent, or Firm* — Hollingsworth Davis, LLC

(57) ABSTRACT

An electronic device comprises electronic circuitry and a molded plastic covering (5). In order to prevent ingress of water and dust, a hermetic seal is provided between the covering (5) and components that are accessible through the covering (5), such as a socket (7) or display, or components such as electrical connections (9). The components (7, 9) are at least partially coated in a coating material 15, such as a thermally activated polyurethane adhesive or thin thermoplastic, to provide a strong bond to the covering (5) that does not require the use of solder. The device may be a wearable device in which waterproof sealing is required.

17 Claims, 5 Drawing Sheets

(51) Int. Cl.
*H04R 1/02* (2006.01)
*H04M 1/05* (2006.01)

(56) References Cited

U.S. PATENT DOCUMENTS

| | | | |
|---|---|---|---|
| 6,718,182 B1 * | 4/2004 | Kung | 455/556.1 |
| 6,927,761 B2 * | 8/2005 | Badaye et al. | 345/173 |
| 7,146,721 B2 * | 12/2006 | Hunkeler et al. | 29/841 |
| 7,536,210 B1 * | 5/2009 | Morris et al. | 455/575.1 |
| 2003/0184523 A1 | 10/2003 | Badaye et al. | |

FOREIGN PATENT DOCUMENTS

| | | |
|---|---|---|
| WO | 0237810 A | 6/2002 |
| WO | 2004023765 A1 | 3/2004 |
| WO | 2006031558 A2 | 3/2006 |

* cited by examiner

MOUNTING COMPONENTS IN ELECTRONIC DEVICES

RELATED APPLICATION

This application was originally filed as PCT Application No. PCT/IB2006/055003 filed on Dec. 21, 2006.

FIELD OF THE INVENTION

The invention relates to a technique for mounting components, such as sockets, displays and so on, suitable for use in waterproof devices. The technique is particularly suitable for, but not limited to use in, portable and wearable electronic devices.

BACKGROUND OF THE INVENTION

An increasing number of devices are being made available in portable form, such as mobile telephones, personal digital assistants, music players, pagers and so on. Such devices typically include a power supply, in the form of a battery. However, as the power that can be provided by a battery is limited, the device must allow recharging and/or replacement of its battery. Therefore, many devices include sockets for receiving a connector for charging the battery and/or are configured to permit access to a battery compartment. In addition, such devices may include other components that are accessible from the exterior of the device, such as displays and keypads of a user interface.

However, where a device is required to be waterproof, the provision of such sockets or accessible components may compromise the degree to which the ingress of water into the device can be prevented. This problem is particularly relevant to, but not limited to, wearable electronic devices. As a consequence of their wearable nature, these devices may be subjected to a variety of environmental conditions, including rain.

While it may be possible to provide a mechanical valve for preventing water ingress around a component such as a socket, display or keypad, such a solution would be expensive, complex and prone to failure.

Another option would be to provide a resilient gasket. The water tightness of the device can then be ensured by maintaining the gasket under pressure to provide a seal. Such a gasket would again be expensive, while being difficult to manufacture. Furthermore, over time, the material of the gasket could harden, reducing its effectiveness. Where a gasket is provided over a socket, the user may be required to manipulate it in order to gain access, which may be inconvenient and potentially cause damage to the gasket.

Another potential solution, in the case of sockets, relies on the use of conductive plastics. Such materials can be injection moulded to provide a seal around electrical components. However, the resistance of such plastics remains relatively high. Consequently, the time required to charge a battery may be lengthy and, thus, inconvenient to a user. Moreover, the plastic material may be subjected to high temperatures, increasing the chance of mechanical failure.

SUMMARY OF THE INVENTION

According to a first aspect of the invention, a device comprises electronic circuitry, a covering arranged to cover said electronic circuitry and a component connected to said electronic circuitry that is accessible from the exterior of the device through an opening in said covering, wherein at least part of said component is coated with a layer of coating material and said covering is bonded to said coating material to provide a hermetic seal between the covering and the component.

In this manner, a seal may be provided between the component and the covering, without requiring a user to manipulate a gasket or closure when access to the component is required. Such a seal may thus be solderless and have a simple configuration that is less expensive to manufacture and more reliable than prior seals using mechanical valves or gaskets.

The component may provide part of a user interface. For instance, the component may be a display.

The component may comprise a socket configured to receive a connector and/or an electrical connection arranged to provide a conductive path from such a socket to said electronic circuitry. For instance, the device may include a rechargeable battery arranged to supply power to said electronic circuitry, in which case the socket may be provided to receive a connector from an external power source and the electrical connection may be arranged to convey power from the socket to the rechargeable battery. Alternatively, or additionally, the device may comprise an audio output, wherein the socket may be arranged to receive a connector from a loudspeaker and said electrical connection is arranged to convey audio signals from the electronic circuitry to said socket. Such a device may further comprise an audio input, for example, where the device is a mobile telephone, or a memory for storing music data, where the device is an audio player.

The device may be a portable device, such as a wearable electronic device.

The coating material may be a thermoactivated coating.

The covering may be formed from a thermoplastic elastomer.

Where required, the covering may be formed from a rigid material.

This aspect also provides a method of manufacturing an electrical device comprising providing electronic circuitry; providing a first component connected to said electronic circuitry, coating at least part of said component with a coating material; and moulding a covering over said coating material, so that said covering is bonded to said coating material to provide a hermetic seal between said component and said covering.

According to a second aspect of the invention, a device comprises electronic circuitry, a socket arranged to receive a connector, an electrical connection arranged to provide a conductive path from said socket to said electronic circuitry and a covering arranged to cover said electronic circuitry, wherein at least one of said socket and said electrical connection comprises a conductive element coated with a layer of coating material, said covering being moulded over and bonded to said layer of coating material to provide a hermetic seal between said covering and said one of said socket and said electrical connection.

According to a third aspect of the invention, a device comprises a device comprises electronic circuitry, a user interface and a covering arranged to cover said electronic circuitry, wherein at least part of said user interface comprises a component coated with a layer of coating material, said covering being moulded over and bonded to said layer of coating material to provide a hermetic seal between said covering and said component.

BRIEF DESCRIPTION OF THE DRAWINGS

Embodiments of the invention will now be described, by way of example, with reference to the accompanying drawings, of which.

DETAILED DESCRIPTION

Figure 1:
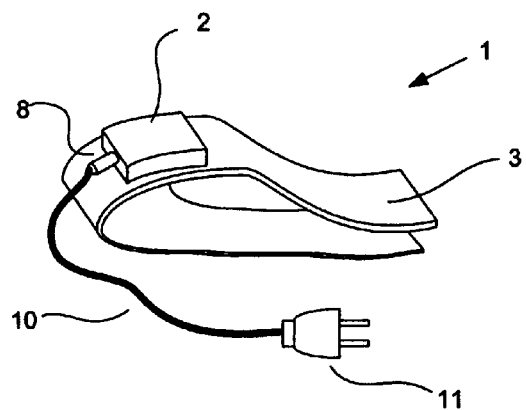
FIG. 1 depicts a wearable device in which an embodiment of the invention is implemented.

FIG. 1 depicts a wearable electronic device 1 in which an embodiment of the invention is implemented. The electronic device 1 comprises an electronic section 2, which is mounted on an armband 3 that can be worn by a user. However, the invention can be used on other electronic devices, including wearable and non-wearable devices.

Figure 2:
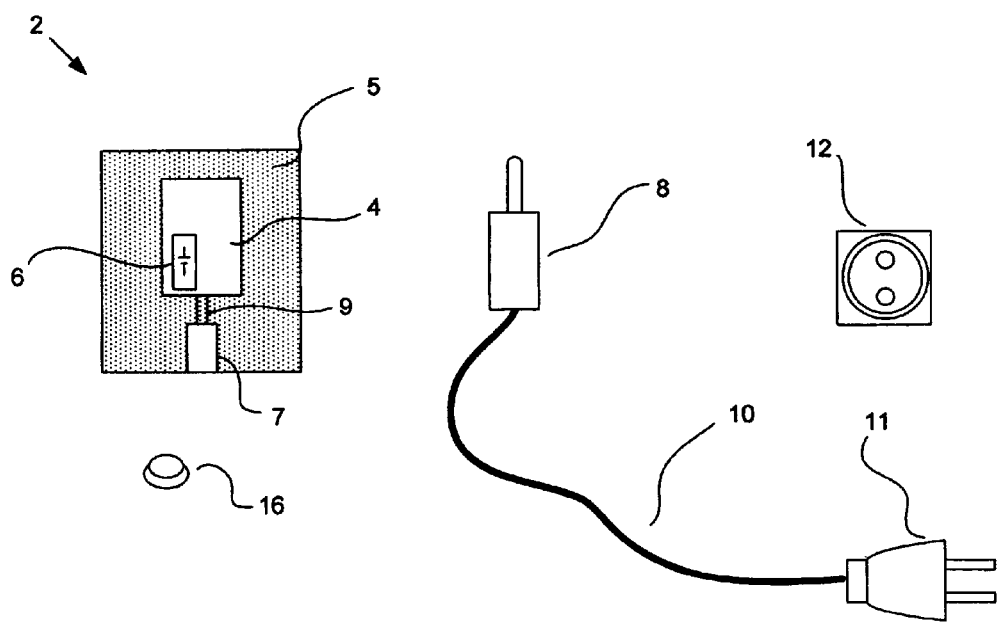
FIG. 2 depicts an electronic section of the wearable device of FIG. 1, along with a connector and lead for use in recharging a battery therein.

In this particular embodiment, the electronic section 2 comprises flexible electronic circuitry 4, as shown in FIG. 2. In order to protect the electronic circuitry 4 from environmental conditions, such as rain, the electronic section 2 is enveloped in a moulded plastic covering 5.

The electronic section 2 is powered by a battery 6. The electronic circuitry 4 includes circuitry for recharging the battery 6. In order to provide such a connection, the electronic section 2 includes a socket 7 for receiving a jack 8 and an electrical connection 9 providing a conductive path between the socket 7 and electronic circuitry 4. In the arrangement shown in FIG. 2, the jack 8 is attached to a cable 10 and plug 11 for connection to the external power source 12, such as a mains supply.

In order to provide prevent water ingress around the socket 7, the moulded plastic covering 5 is hermetically sealed to the socket 7 and electrical connection 9.

Figure 3:
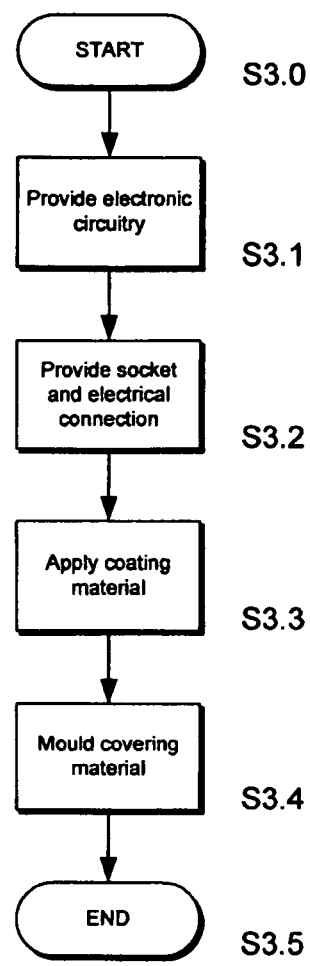
FIG. 3 is a flowchart of a process for providing a sealed component in the device of FIG. 1.

A procedure for manufacturing the electronic section of FIG. 2 will now be described, with reference to FIG. 3.

Starting at step s3.0, the electronic circuitry 4 is provided (step s3.1), along with the socket 7 and the connection 9 between the socket 7 and the electronic circuitry (step s3.2).

Figure 4:
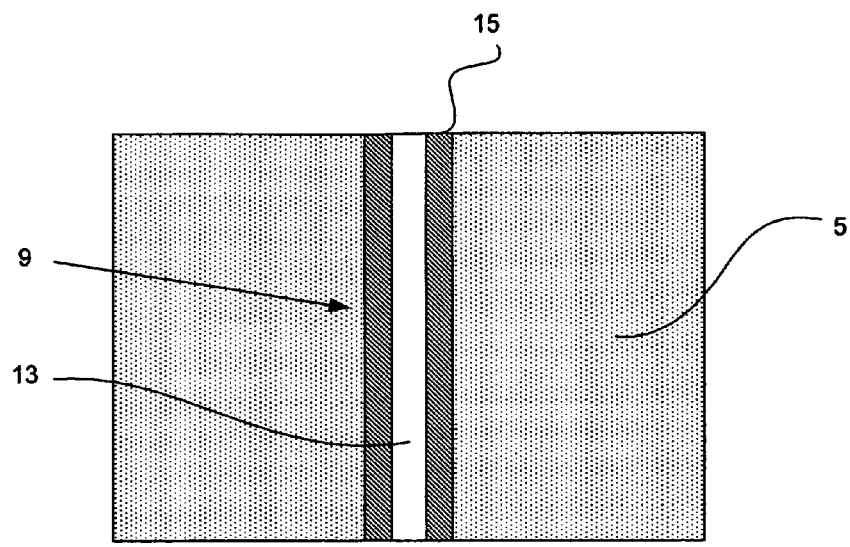
FIG. 4 is a detailed view of an electrical connection of the electronic section shown in FIG. 2.
Figure 5:
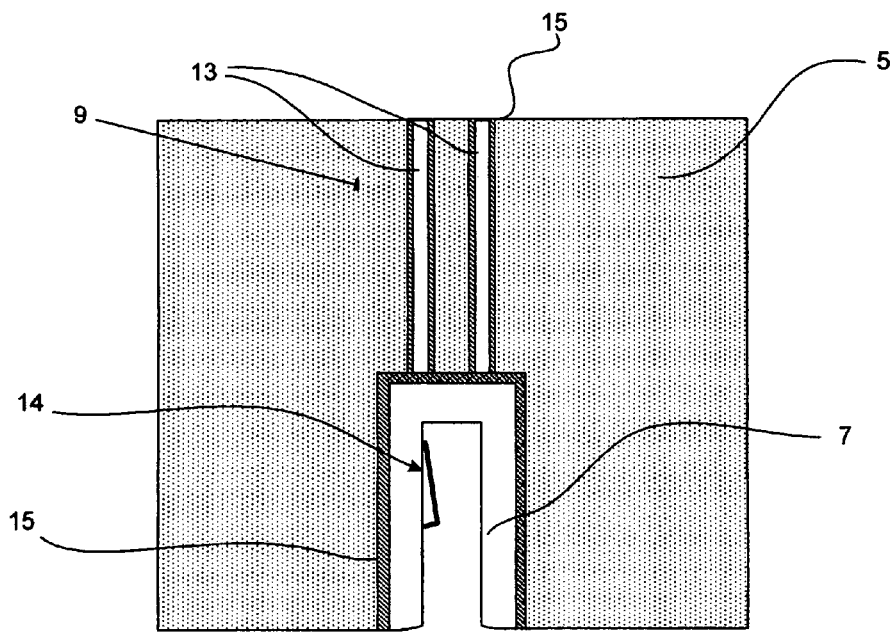
FIG. 5 is a detailed view of the socket of the electronic section shown in FIG. 2.

FIGS. 4 and 5 are enlarged views of part of the electrical connection 9 and the socket 7 respectively. The electrical connection is formed of conductive material, such as one or more stainless steel wires 13. In this particular embodiment, the socket 7 is also formed of a conductive material, such as stainless steel, and comprises resilient means, such as spring 14, for retaining a jack 8 when inserted in the socket 7. Other suitable conductive materials for forming the wires 13 and/or socket 7 include copper and aluminium.

At least one of the socket 7 and electrical connection 9 is covered with a layer of coating material 15 (step s3.3). In this particular embodiment, both the socket 7 and electrical connection 9 are coated.

The coating material 15 is selected to provide adhesion between the conductive material of the electrical connection 9 and the covering 5, so that a hermetic seal can be achieved without the use of solder. The coating material 15 may be an adhesive, such as a thermally activated polyurethane adhesive, or a thin thermoplastic. A layer of such coating material can be activated by heat applied during the moulding process, to bond the plastic covering 5 to the socket 7 and/or wires 13.

The coating material 15 may be applied in selected areas of the socket 7 and/or wires 13 using a spraying, dipping, pad printing or silk printing. Where the coating material 15 is to be applied to a sheet metal, a laminating process may be used, with or without masking. For example, a polycarbonate film coating may be provided using such a laminating process.

The plastic covering 5 is then moulded (step s3.4). The plastic covering 5 is formed over the circuitry 4 and coating material 15, for example, by an injection-moulding process, thereby sealing the electronic section 2.

The plastic covering 5 of the electronic device 1 can be formed from any kind of thermoplastics suitable for the moulding process used. For example, the plastic covering 5 may be an elastic material, such as thermoplastic urethane. Alternatively, the plastic covering 5 may be formed of a rigid and/or fibre reinforced plastic, such as a polyester. The choice of covering material will depend, in part, on the type and intended use of the electronic device.

In this particular embodiment, the electronic section 2 is flexible and the plastic covering 5 is formed of a flexible material such as polyurethane. However, as noted above, alternative plastic coverings may be provided, depending on the flexibility required. Any plastic covering material that adheres to the coating material 15 can be employed. For example, a polyester plastic covering 5 may be provided where a polyester coating material 15 is used. Where the coating material 15 is a thermoactivated adhesive material, a wide range of covering materials can be used.

Other examples of suitable materials for the plastic covering 5 include any thermoplastic elastomer with sufficient fatigue resistance, for example, thermoplastic polyurethane, a styrene block-co-polymer, thermoplastic silicone elastomer or thermoplastic vulcanisate. Alternatively, if a bit more rigid covering material is required, polyolefins, polyasetals, polyesters, polyacrylates, polyamides, polyphenylesulfide, polyarylamides or blends of above mentioned thermoplastics or a reinforced thermoplastic might be suitable.

Where the plastic covering 5 is injection moulded around the coated socket 7, shrinkage of the plastic covering 5 may improve the bond between the socket 7 and covering 5. However, the coating material 15 is still required in order to produce a hermetic seal at the interface between the socket 7 and plastic covering 5.

The procedure is then complete (step s3.5).

The use of the coating material 15 in the electronic section 2 of FIG. 2 results in a seal at the interface between the electrical connection 9 and plastic covering 5 and between the socket 7 and plastic covering 5 that has good reliability. The seal can thus prevent the ingress of water and other foreign matter, such as dust, into the electronic section 2. There is no requirement for a user to attach or remove a cover or manipulate a sealing gasket in order to access the socket 7. However, if required, a cap 16 may be provided to prevent water ingress into the socket 7 when access to the socket 7 is not in use.

Figure 6:
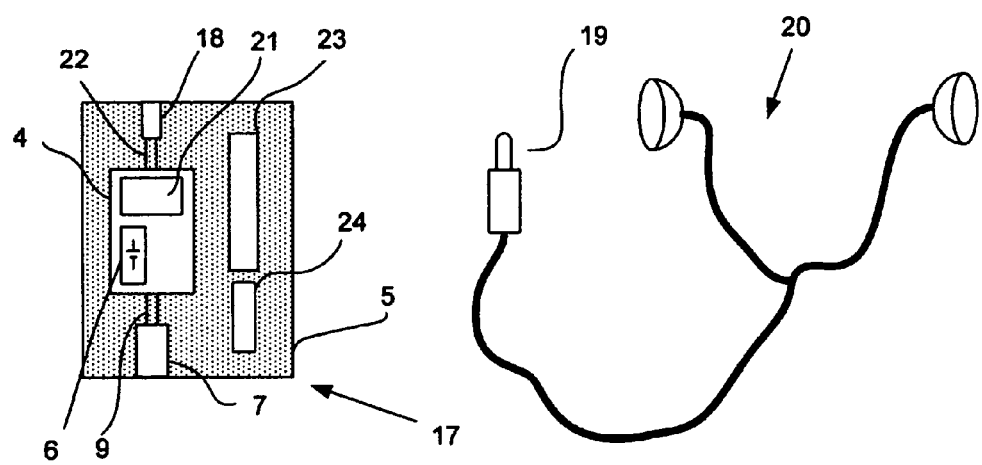
FIG. 6 depicts an electronic section of a device in which another embodiment of the invention is implemented, along with earphones for connection thereto.

In other embodiments of the invention, sockets and/or electrical connections of other types may be sealed by providing a similar layer of coating material 15. For example, FIG. 6 depicts an alternative electronic device 17, which comprises an audio output 18 for receiving a jack 19 from a pair of earphones 20. In this particular embodiment, the electronic circuitry 4 includes a memory 21 for storing audio files for playback through the earphones 20. An electrical connection 22 is arranged to convey audio signals from the electronic circuitry 4 to the audio output 18. One or both of the audio output 18 and the electrical connection 22 is/are pre-coated with a coating material 15 before being covered with a moulded plastic covering 5.

In the embodiment shown in FIG. 6, a user interface is also provided, which includes a display 23 and a keypad 24. The display 23 and keypad 24 are not covered by the plastic covering 5. One or more of the display 23 and keypad 24 may be coated in the coating material 15 in order to provide a hermetic seal at the interface with the plastic covering 5, in a similar manner to the socket 7 and electrical connection 9 of the device 1 as described above.

Figure 7:
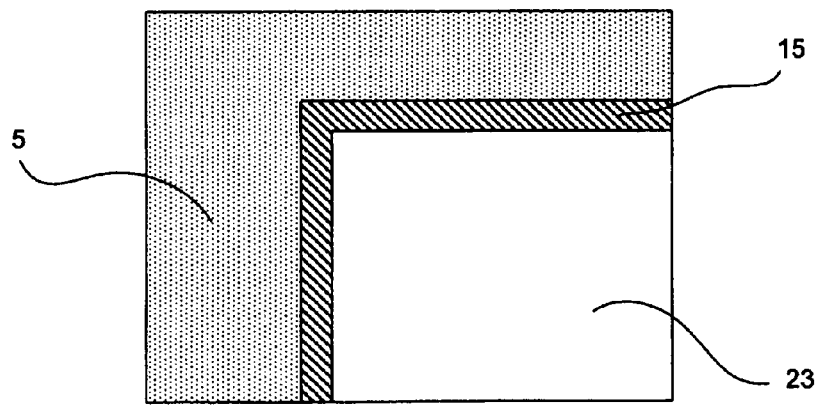
FIG. 7 is an enlarged view of part of the device of FIG. 6.

FIG. 7 is an enlarged view of part of the display 23. The display 23 may be provided in the form of a liquid crystal display panel, a light emitting diode array, or organic light emitting diode array. Coating material 15 is provided on part of the display 23 to provide a bond to the plastic covering 5.

Figure 8:
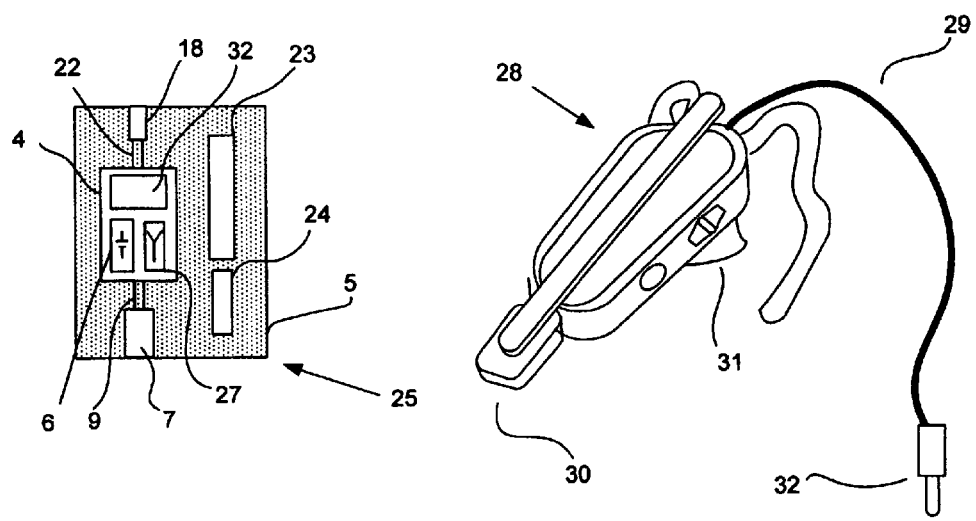
FIG. 8 depicts an electronic section of a mobile telephone device in which yet another embodiment of the invention is implemented, along with a headset for connection thereto.

In another embodiment, shown in FIG. 8, a mobile telephone device 25 comprises a display 23, keypad 24, transceiver 26 and antenna 27. The mobile telephone device 25 may be connected to a headset 28 via a cable 29, the headset 28 comprising a microphone 30 and speaker 31. The mobile telephone 25 comprises an audio input/output 32 for receiving a jack 33 of the headset 28 and an electrical connection 34 for conveying audio signals between the audio input/output 32 and the transceiver 26.

The headset 28 may itself be provided with a socket, not shown, sealed in the manner described above in order to permit recharging of an internal battery, not shown.

In yet another embodiment, a mobile telephone 25 may be integrated into the headset 28 and provided with such a socket to permit recharging of an internal battery.

Figure 9:
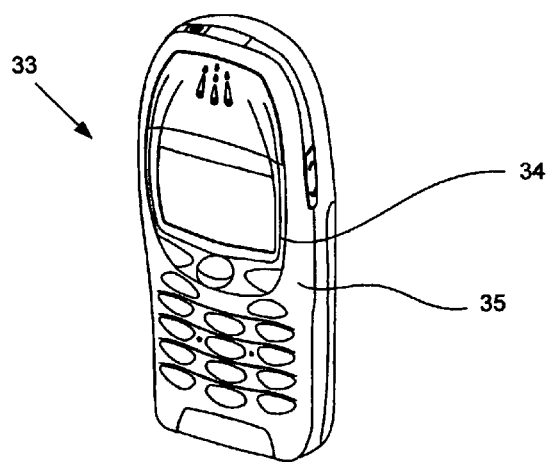
FIG. 9 is a mobile telephone device in which a further embodiment of the invention is implemented.

While the embodiments described above relate to wearable devices, the invention may be used to provide one or more waterproof connections in other types of devices where the prevention of water or dust ingress is desirable. For example, FIG. 9 depicts a mobile telephone 33 that is not a wearable device. The invention may be used to provide seals between various components of the mobile telephone 33, such as the display 34 and a moulded housing 35, by coating the relevant component with a coating material prior to the moulding process.

While the embodiments utilise the invention for sealing sockets, displays or keypads in an electronic section 2, the invention may be used to seal wiring and other interconnections within such devices or to provide a seal between other components of an electronic device.

It should be realised that the foregoing examples should not be construed as limiting. Other variations and modifications will be apparent to persons skilled in the art upon reading the present application. Such variations and modifications extend to features already known in the field, which are suitable for replacing the features described herein, and all functionally equivalent features thereof. Moreover, the disclosure of the present application should be understood to include any novel features or any novel combination of features either explicitly or implicitly disclosed herein or any generalisation thereof and during the prosecution of the present application or of any application derived therefrom, new claims may be formulated to cover any such features and/or combination of such features.

The invention claimed is:

1. A device comprising:
   electronic circuitry;
   a covering arranged to cover said electronic circuitry; and
   a component connected to said electronic circuitry that is accessible from the exterior of the device through an opening in said covering;
   wherein at least part of said component is coated with a layer of thermoactivated coating material and said covering is bonded to said layer of thermoactivated coating material by heat activating the layer of thermoactivated coating material to provide a hermetic seal between the covering and the component.

2. A device according to claim 1, wherein said component provides part of a user interface.

3. A device according to claim 1, wherein said component is a display.

4. A device according to claim 1, wherein said component comprises at least one of:
   a socket configured to receive a connector; and
   an electrical connection arranged to provide a conductive path from a socket to said electronic circuitry.

5. A device according to claim 4, comprising:
   a rechargeable battery arranged to supply power to said electronic circuitry;
   wherein:
   said socket is arranged to receive a connector from an external power source; and
   said electrical connection is arranged to convey power from the socket to the rechargeable battery.

6. A device according to claim 4, comprising:
   an audio output;
   wherein:
   said socket is arranged to receive a connector from a loudspeaker; and
   said electrical connection is arranged to convey audio signals from the electronic circuitry to said socket.

7. A device according to claim 6, comprising a memory configured to store music data.

8. A device according to claim 4, comprising:
   an audio output; and
   an audio input;
   wherein said electrical connection is arranged to convey audio signals to and from the electronic circuitry to said socket.

9. A device according to claim 1, in the form of a portable electronic device.

10. A device according to claim 9, in the form of a wearable device.

11. A device according to claim 1, wherein said covering is a thermoplastic elastomer.

12. A device according to claim 1, wherein said covering is a rigid material.

13. A device according to claim 1, comprising:
   a user interface; and
   wherein at least part of said user interface comprises said component.

14. A device according to claim 13, wherein said component is a display.

15. A method of manufacturing an electrical device comprising:
   providing electronic circuitry;
   providing a first component connected to said electronic circuitry;
   coating at least part of said component with a thermoactivated coating material; and
   moulding a covering over said thermoactivated coating material and heat activating the layer of thermoactivated coating material, so that said covering is bonded to said thermoactivated coating material to provide a hermetic seal between said component and said covering.

16. A method according to claim 15, wherein:
said providing a first component comprises providing a socket arranged to receive a connector from an external device and providing an electrical connection between said socket and circuitry; and
said component comprises at least one of said socket and said electrical connection.

17. A device comprising:
electronic circuitry;
a socket arranged to receive a connector; and
an electrical connection arranged to provide a conductive path from said socket to said electronic circuitry; and
a covering arranged to cover said electronic circuitry;
wherein at least one of said socket and said electrical connection comprises a conductive element coated with a layer of thermoactivated coating material, said covering being moulded over and bonded to said layer of thermoactivated coating material by heat activating the layer of thermoactivated coating material to provide a hermetic seal between said covering and said one of said socket and said electrical connection.

* * * * *